(12) United States Patent
Betsui

(10) Patent No.: US 10,249,560 B2
(45) Date of Patent: Apr. 2, 2019

(54) SEMICONDUCTOR DEVICE, SYSTEM IN PACKAGE, AND SYSTEM IN PACKAGE FOR VEHICLE

(71) Applicant: Renesas Electronics Corporation, Tokyo (JP)

(72) Inventor: Takafumi Betsui, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/657,689

(22) Filed: Jul. 24, 2017

(65) Prior Publication Data

US 2018/0090424 A1    Mar. 29, 2018

(30) Foreign Application Priority Data

Sep. 27, 2016    (JP) .................................. 2016-188185

(51) Int. Cl.
| | |
|---|---|
| *H01L 23/498* | (2006.01) |
| *H01L 23/00* | (2006.01) |
| *H01L 23/50* | (2006.01) |
| *H01L 23/538* | (2006.01) |

(52) U.S. Cl.
CPC .. *H01L 23/49816* (2013.01); *H01L 23/49833* (2013.01); *H01L 23/49838* (2013.01); *H01L 23/50* (2013.01); *H01L 23/5385* (2013.01); *H01L 23/5386* (2013.01); *H01L 24/16* (2013.01); *H01L 2224/16225* (2013.01); *H01L 2924/15311* (2013.01)

(58) Field of Classification Search
CPC . H01L 23/498; H01L 23/00; H01L 23/49816; H01L 24/16; H01L 2224/16225; H01L 23/49838; H01L 23/49833; H01L 23/50; H01L 23/5385; H01L 23/5386; H01L 2923/15311
USPC ................ 257/738, 737, 778, 723, 686, 685
See application file for complete search history.

(56) References Cited

U.S. PATENT DOCUMENTS

| | | | |
|---|---|---|---|
| 5,894,410 A | 4/1999 | Barrow | |
| 6,294,407 B1 * | 9/2001 | Jacobs | ................ H01L 21/4839 438/108 |
| 7,247,945 B2 | 7/2007 | Sawada | |

(Continued)

FOREIGN PATENT DOCUMENTS

| | | | | |
|---|---|---|---|---|
| JP | 11-24099 | * | 1/1999 | ............. G02F 1/136 |
| JP | 2006-196874 A | | 7/2006 | |

OTHER PUBLICATIONS

Extended European Search Report received in corresponding European Application No. 17190758.7 dated May 3, 2018.

*Primary Examiner* — Alexander Oscar Williams
(74) *Attorney, Agent, or Firm* — Mattingly & Malur, PC

(57) ABSTRACT

The object is to suppress rupture of the soldering balls when an atmosphere varying from a high temperature to a low temperature is repeated. A semiconductor device includes a semiconductor integrated circuit and a substrate. The semiconductor integrated circuit is, for example, a semiconductor chip. The coefficient of thermal expansion is different between the semiconductor integrated circuit and the substrate. The substrate includes a plurality of soldering balls on the opposite surface to the surface where the semiconductor integrated circuit is mounted. The substrate does not have the soldering balls at a position corresponding to at least one side of the fringe of the semiconductor integrated circuit.

10 Claims, 7 Drawing Sheets

(56) References Cited

U.S. PATENT DOCUMENTS

| | | | |
|---|---|---|---|
| 7,868,409 B2* | 1/2011 | Sasaki | H01L 23/49822 257/491 |
| 2001/0056544 A1* | 12/2001 | Walker | B60R 25/02 726/2 |
| 2006/0192282 A1 | 8/2006 | Suwa et al. | |
| 2008/0012152 A1 | 1/2008 | Meyer et al. | |
| 2008/0039992 A1* | 2/2008 | Lohberg | G01P 15/0888 701/31.4 |
| 2010/0053923 A1 | 3/2010 | Matsui et al. | |
| 2011/0006433 A1 | 1/2011 | Kanetaka | |
| 2016/0336262 A1* | 11/2016 | Yamashita | H05K 3/368 |
| 2018/0090424 A1* | 3/2018 | Betsui | H01L 23/49816 |
| 2018/0103216 A1* | 4/2018 | Sakakibara | H04N 5/359 |

* cited by examiner

SEMICONDUCTOR DEVICE, SYSTEM IN PACKAGE, AND SYSTEM IN PACKAGE FOR VEHICLE

CROSS-REFERENCE TO RELATED APPLICATIONS

The disclosure of Japanese Patent Application No. 2016-188185 filed on Sep. 27, 2016 including the specification, drawings and abstract is incorporated herein by reference in its entirety.

BACKGROUND

The invention relates to a semiconductor device, a system in package, and a system in package for vehicle, and more particularly, to a semiconductor device, a system in package, and a system in package for vehicle with an integrated circuit mounted on a substrate having electrodes for soldering balls.

Japanese Unexamined Patent Application Publication No. 2006-196874 discloses a semiconductor device including a semiconductor package mounted on a printed wiring substrate. In the above publication, a semiconductor package has a soldering ball group including a plurality of soldering balls. The soldering balls are to electrically couple a semiconductor element within the semiconductor package to the printed wiring substrate.

SUMMARY

The semiconductor device disclosed in Japanese Unexamined Patent Application Publication No. 2006-196874, however, has such a problem that the soldering balls are easily ruptured at a specified position when an atmosphere varying from a high temperature to a low temperature is repeated, hence to deteriorate in a reliability.

Other problems and novel characteristics will be apparent from the description of the specification and the attached drawings.

According to one embodiment, a semiconductor device is designed in that a semiconductor integrated circuit is mounted on a substrate having electrodes for soldering balls and that the electrodes for the soldering balls are not provided at a position corresponding to at least one side of the fringe of the semiconductor integrated circuit.

According to another embodiment, a semiconductor system in package is designed in that a semiconductor integrated circuit is mounted on a package substrate including the electrodes for the soldering balls and that the electrodes for the soldering balls are not provided at the position corresponding to at least one side of the fringe of the semiconductor integrated circuit.

According to further another embodiment, a semiconductor system in package for vehicle is designed in that a semiconductor integrated circuit receiving sensor information and a memory element are mounted on a package substrate including electrodes for soldering balls and that the electrodes for the soldering balls are not provided at the position corresponding to at least one side of the fringe of the semiconductor integrated circuit.

According to the above embodiments, even when an atmosphere varying from a high temperature to a low temperature is repeated, a semiconductor device, a system in package, and a system for vehicle free from rupture of the soldering balls with a high reliability can be obtained.

DETAILED DESCRIPTION

Figure 13:
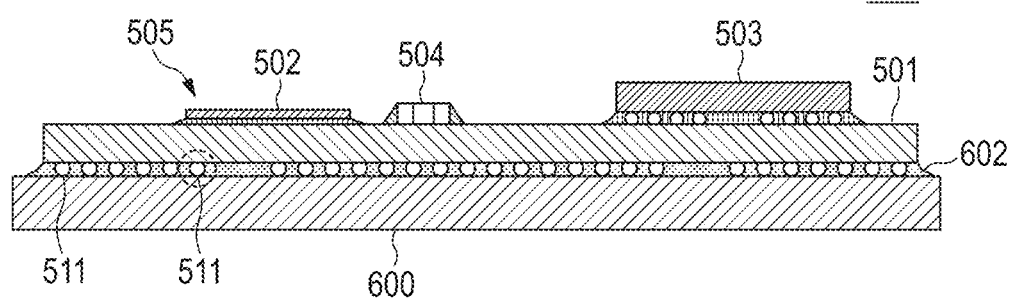
FIG. 13 is a cross-sectional view showing the SiP mounted on the substrate.

Prior to the description of an embodiment, the background up to arriving at the embodiment will be described. FIG. 13 is a cross-sectional view of System In Package (SiP) mounted on a substrate. The SiP is made by sealing, for example, a plurality of die chips (semiconductor integrated circuit) into one package. The SiP 500 includes a package substrate 501, a semiconductor integrated circuit 502, a memory element 503, and a passive element 504 such as a capacitor. The semiconductor integrated circuit 502 and the memory element 503 are flip-chip mounted on, for example, the package substrate 501. The passive element 504 is, for example, soldered to the package substrate 501.

In the SiP 500, the package substrate 501 is made of a resin material. The semiconductor integrated circuit 502 is, for example, a bare chip and a semiconductor element made of Si as a material. The memory element 503 is formed as a package including the resin substrate. Assumed that the coefficient of thermal expansion of the package substrate 501 is different from that of the semiconductor integrated circuit 502 and that the coefficient of thermal expansion of the package substrate 501 is substantially equal to that of the memory element 503.

The package substrate 501 includes a plurality of soldering balls 511 at the surface opposite to the surface where the semiconductor integrated circuit 502 and the memory element 503 are mounted. The plural soldering balls 511 are arranged on the whole surface of the package substrate 501 at a predetermined cycle or in peripheral way. The package substrate 501 is flip-chip mounted on the substrate 600 such as a system board or a motherboard. The substrate 600 is formed of a resin material, similarly to the package substrate 501. An underfill resin 602 seals the space between the package substrate 501 and the substrate 600.

The inventor et al. performed a temperature cycle test on the substrate 600 with the SiP 500 secondarily mounted there as shown in FIG. 13. Here, the temperature cycle test is an atmosphere test in which a sample is put in an atmosphere sequentially varying from a low temperature to a high temperature with a stress added at a predetermined cycle. As the result of the temperature cycle test, it is confirmed that the soldering balls arranged just under the fringe of the semiconductor integrated circuit 502 are easy to rupture. It is considered that the rupture of the soldering balls happens because a stress caused by a difference of the thermal expansion amount between the above and the package substrate 501 is added, at a position corresponding to the end portion of the semiconductor integrated circuit 502.

The rupture of the soldering balls happens particularly just under the side farthest (remote side) 505 from the center of the package substrate 600, of the four sides of the rectangular semiconductor integrated circuit 502. Specifically, in FIG. 13, the soldering ball 511 just under the remote side 505 of the semiconductor integrated circuit 502 surrounded by the dotted line is easiest to rupture. When the soldering ball 511 ruptures, a contact failure or an open failure happens, hence to avoid the normal operation of the SiP 500. This problem is not restricted to the SiP 500 but similarly happens also in a semiconductor device in which a semiconductor integrated circuit having a different coefficient of thermal expansion from a substrate is mounted on the substrate.

Hereinafter, an embodiment with the means for solving the above problem applied will be described in details. For the sake of brief description, the following description and the drawings are properly omitted and abbreviated. In the drawings, the same reference numerals are attached to the same elements and the overlapped description is saved depending on the necessity.

When the necessity arises for the sake of convenience in the following embodiments, the embodiments will be described divided into a plurality of sections or forms; unless particularly specified, they are related to each other and one is related to the other in a part or the whole of the modified and application examples as the details and supplementary description. Further, in case of referring to the number of the elements (including piece, numeric value, amount, and range), in the following embodiments, the number is not restricted to the specified number but may be more or less than the specified number, unless particularly specified and unless restricted to the specified number apparently on the principle.

Further, in the following embodiments, the components are not always essential unless particularly specified and unless apparently considered essential on the principle. Similarly, in the following embodiments, when referring to the shape and the positional relation of the components, they are to include their similarity or approximation unless particularly specified and unless they have apparently different shape and positional relation on the principle. This is true to the above number (including piece, numeric value, amount and range).

First Embodiment

Figure 1:
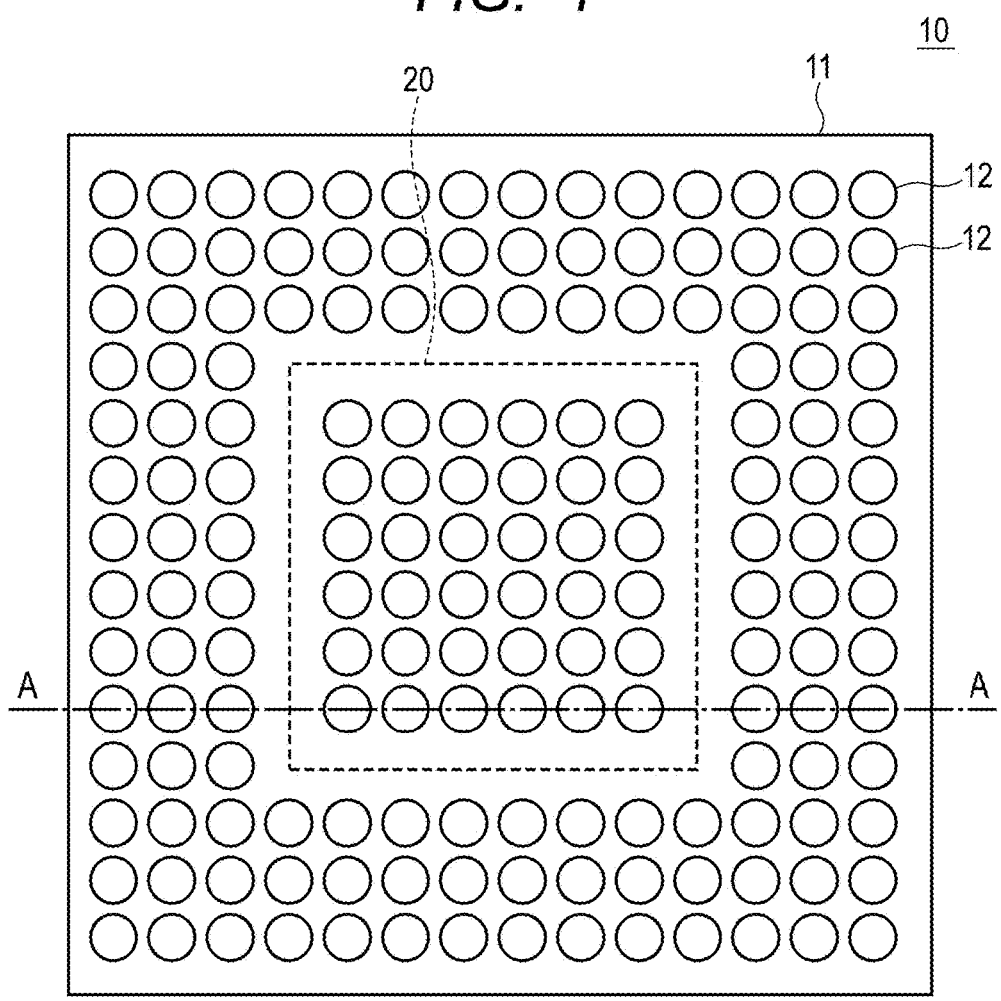
FIG. 1 is a top plan view showing a semiconductor device according to a first embodiment.

FIG. 1 is a top plan view showing a semiconductor device according to a first embodiment. The semiconductor device 10 includes a substrate 11, a semiconductor integrated circuit 20, and a plurality of soldering balls 12. The semiconductor device 10 is a semiconductor device, for example, in a Ball Grid Array (BGA) package shape. The semiconductor integrated circuit (hereinafter, referred to as an integrated circuit simply) 20 is mounted on one surface of the substrate 11. The substrate 11 includes a plurality of BGA terminals (soldering balls) 12 on the other surface opposite to the above surface having the integrated circuit 20 mounted there. The plan view shown in FIG. 1 shows the substrate 11 viewed from the surface opposite to the surface having the integrated circuit 20 mounted there. In FIG. 1, the position (its periphery) to mount the integrated circuit 20 is shown by the dashed line.

Figure 2:
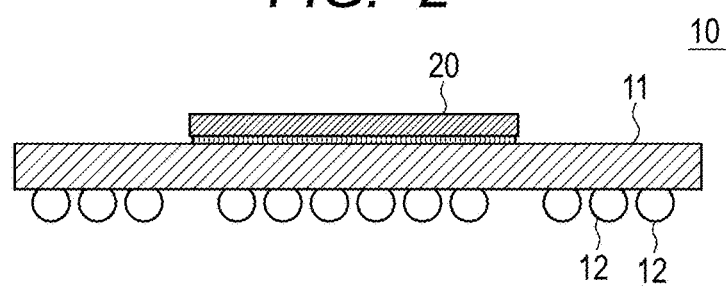
FIG. 2 is a cross-sectional view showing the cross section taken along the line A-A in FIG. 1.

FIG. 2 is a cross-sectional view showing the cross section taken along the line A-A of FIG. 1. The integrated circuit 20 is a semiconductor element (semiconductor chip) made of, for example, Si as a material. The integrated circuit 20 is flip-chip mounted on the substrate 11, for example, using a soldering bump. The mounting method of the integrated circuit 20 (method to couple the above to the substrate 11) is not particularly restricted but the integrated circuit 20 may be coupled to the substrate 11 according to a wire bonding. The substrate 11 is formed by, for example, a resin material. The semiconductor device 10 is secondarily mounted on another substrate such as a system board or a motherboard made of resin material.

Here, the coefficient of thermal expansion of the substrate 11 is about $7 \times 10^{-6}/K$ to $9 \times 10^{-6}/K$. On the other hand, the coefficient of thermal expansion of the integrated circuit 20 is about $3 \times 10^{-6}/K$ to $3.8 \times 10^{-6}/K$. Thus, in the semiconductor device 10, the coefficient of thermal expansion of the substrate 11 is different from that of the integrated circuit 20. When this semiconductor device 10 is used in an atmosphere varying from a high temperature to a low temperature in a repeated way, a stress is added to the substrate 11, caused by a difference of the coefficient of thermal expansion. This stress is strongest at the position corresponding to the fringe of the integrated circuit 20.

In the embodiment, as shown in FIG. 2, the soldering balls 12 are not arranged on the substrate 11 on the opposite side at the position corresponding to the fringe with the substrate 11. In other words, the substrate 11 does not have the soldering balls 12 at the position corresponding to the fringe of the integrated circuit 20 on the opposite surface to the surface having the integrated circuit 20 mounted there. In this embodiment, particularly, as shown in FIG. 1, the substrate 11 does not have the soldering balls 12 at the position corresponding to the four sides of the rectangular integrated circuit 20.

Generally, the soldering balls 12 are arranged with certain regularity on one surface of the substrate 11. For example, the soldering balls 12 are arranged at a predetermined pitch in a direction along one side of the substrate 11 and in a direction along the other side orthogonal to the above on the whole surface. In the embodiment, the regularity is collapsed in a portion corresponding to the fringe of the integrated circuit 20, where the soldering balls 12 are not arranged. Even at the position where the soldering balls 12 should be arranged if arranging the soldering balls 12 according to the regularity, the soldering balls 12 are not provided at the position corresponding to the fringe of the integrated circuit 20. In FIG. 1, the soldering balls in one column and one row are removed from the substrate 11 in the portion corresponding to the fringe of the integrated circuit 20, and the substrate 11 has the portion without the soldering balls 12.

Conclusion

In the embodiment, the substrate 11 does not have the soldering balls 12 used for the secondary mounting of the semiconductor device 10 at the position corresponding to the fringe of the integrated circuit 20. If the soldering balls 12 are formed on the whole surface of the semiconductor device 10, when this semiconductor device is secondarily mounted on another resin substrate and the atmosphere varying from a high temperature to a low temperature is repeated, a strong stress is added to the substrate 11 at the position corresponding to the fringe of the integrated circuit 20. According to this, the soldering balls 12 existing at the position corresponding to the fringe of the integrated circuit 20 on the substrate 11 are easily ruptured. In the embodiment, the substrate 11 does not have the soldering balls 12 at the position where the soldering balls 12 are easily ruptured. Therefore, even when the semiconductor device 10 of the embodiment is secondarily mounted on the resin substrate, an open failure and a contact failure can be suppressed between the resin substrate and the semiconductor device 10.

Modified Example

Figure 3:
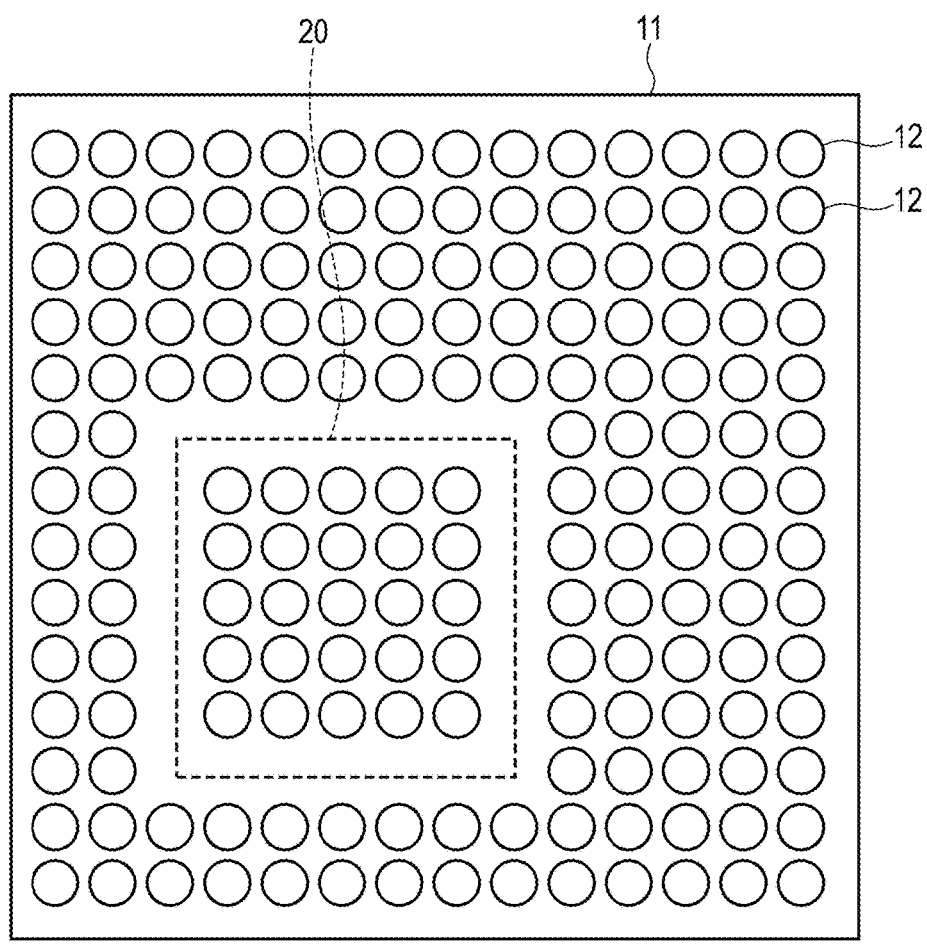
FIG. 3 is a top plan view showing another example of the arrangement of a semiconductor integrated circuit.

FIG. 1 shows an example in which the center of the substrate 11 agrees with the center of the integrated circuit 20; however, the arrangement of the integrated circuit 20 is not restricted to this. FIG. 3 shows another example of the arrangement of the integrated circuit 20. In this example, the center of the substrate 11 is deviated from the center of the integrated circuit 20 (eccentric). Also in this case, the soldering balls 12 are arranged in the portion other than the position corresponding to the fringe of the integrated circuit 20, hence to obtain the same effect as mentioned above, similarly to the above.

In the embodiment, the soldering balls 12 are not provided in the position corresponding to all the four sides of the integrated circuit 20; however, it is not restricted to this. The substrate 11 may have a portion without the soldering balls 12 at the position corresponding to at least one side of the fringe of the integrated circuit 20. When the substrate 11 has the soldering balls 12 also at the position corresponding to the fringe of the integrated circuit 20, the strongest stress is added to the soldering ball 12 existing at the farthest position from the center of the substrate 11, of the positions corresponding to the fringe of the integrated circuit 20. Particularly, in the eccentric arrangement shown in FIG. 3, the substrate 11 should not have the soldering balls 12 at the position corresponding to the farthest side from its center, of the fringe of the integrated circuit 20.

Second Embodiment

Continuously, a second embodiment will be described. In the embodiment, a semiconductor device is formed as System In Package (SiP) module (semiconductor system in package). The SiP includes at least one semiconductor integrated circuit and a package substrate with at least one semiconductor element mounted there. The package substrate includes a plurality of soldering balls on the surface opposite to the surface with at least one semiconductor integrated circuit mounted there. In the embodiment, the package substrate does not have the soldering balls at the position corresponding to at least one side of the fringe of at least one semiconductor integrated circuit.

Figure 4:
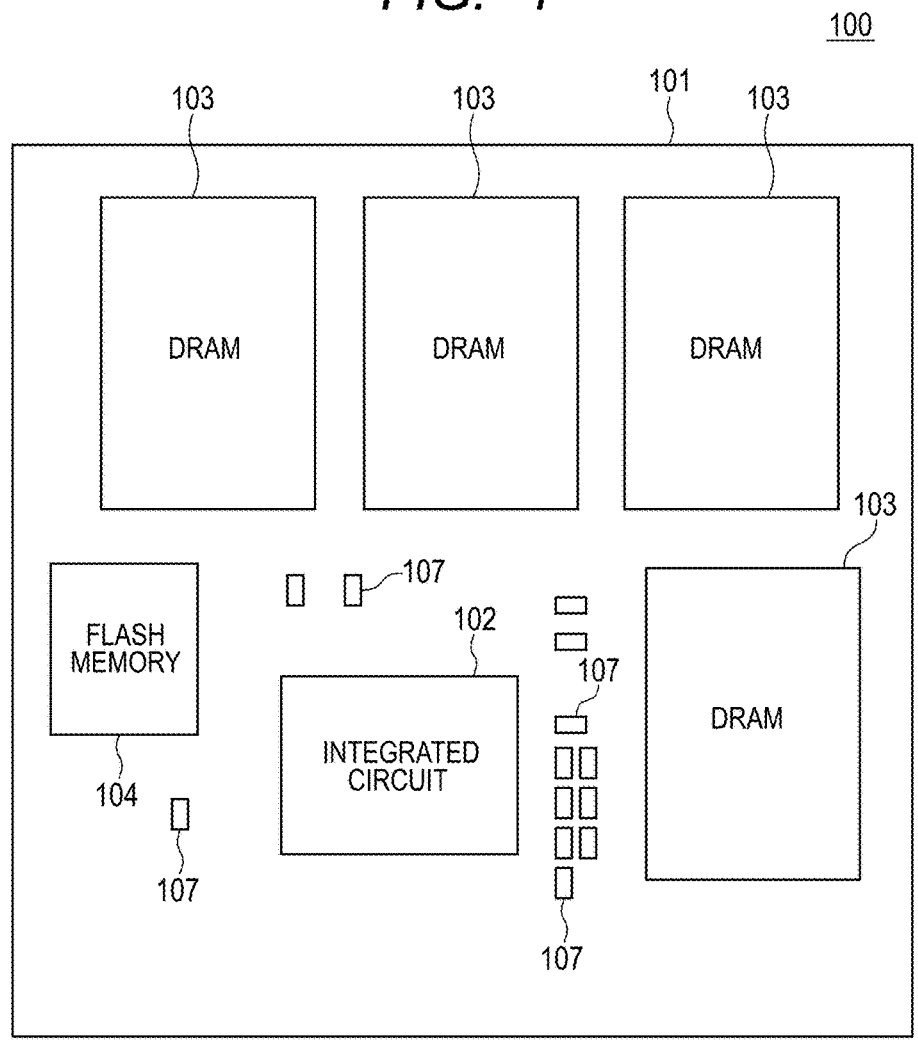
FIG. 4 is a view showing the arrangement example of the components in SiP according to a second embodiment.

FIG. 4 shows the arrangement example of the components in the SiP according to the second embodiment. The SiP 100 includes an integrated circuit 102, a plurality of Dynamic Random Access Memory (DRAM) elements 103, a flash memory 104, and a plurality of passive elements 107. In the SiP 100, a plurality of components including the integrated circuit 102 are mounted on the package substrate 101.

The integrated circuit 102 is, for example, a semiconductor chip. The DRAM 103 and the flash memory 104 are memory elements formed as molded BGA packages. The passive element 107 is a passive part such as a capacitor and a resistor formed by a smaller part than the integrated circuit 102. The SiP 100 is a flat type SiP with the integrated circuit 102, the DRAMs 103, the flash memory 104, and the passive elements 107 as the components coupled to metal terminals existing on the same plan surface as the package substrate 101. The package substrate 101 includes a plurality of soldering balls not illustrated on the surface opposite to the surface with the integrated circuit 102 and the like mounted thereon. Generally, the soldering balls are arranged on the whole surface of the package substrate 101 or in a peripheral way.

Figure 5:
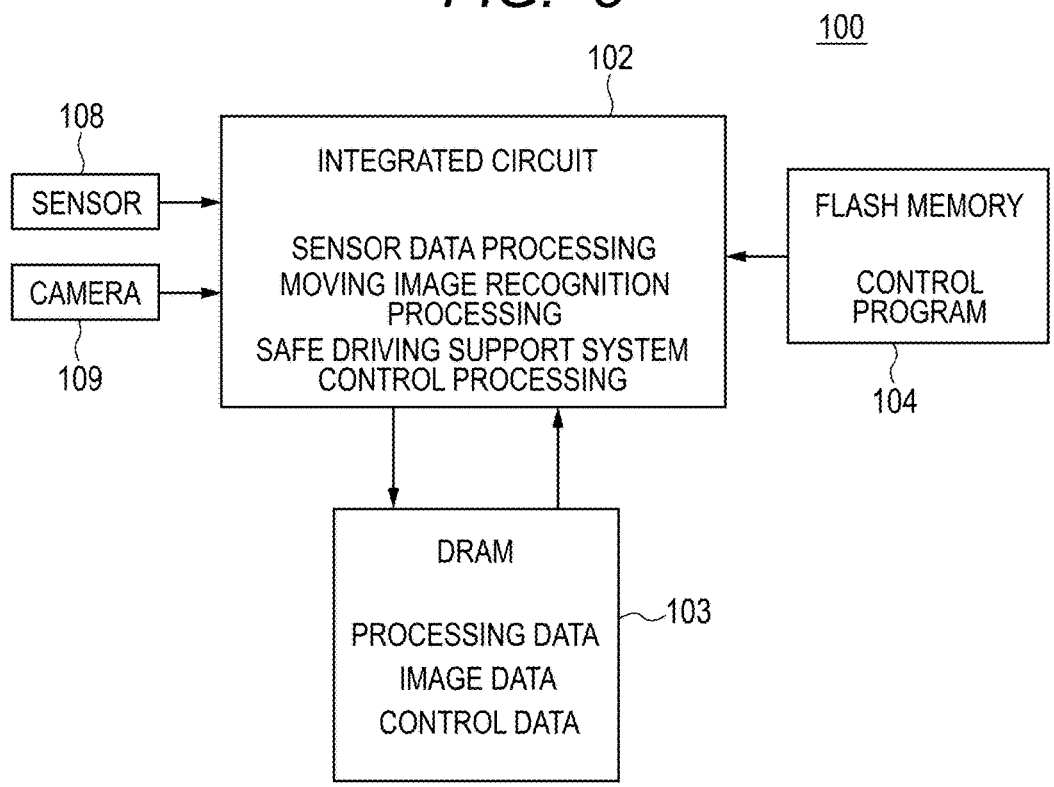
FIG. 5 is a function block diagram showing the SiP.

FIG. 5 is a functional block diagram of the SiP 100. The integrated circuit 102 includes a processor and performs the processing based on the sensor information input from at least one on-vehicle sensor. The integrated circuit 102 performs sensor data processing, moving image recognition processing, or safe driving support system control processing, according to the information input from a sensor 108, for example, a speed sensor, a radar, or an acceleration sensor and the information input from a camera (image sensor) 109.

The DRAM 103 is a volatile memory used by the integrated circuit 102. The integrated circuit 102 stores, for example, processing data, image data, or control data in the DRAMs 103. The flash memory 104 is a nonvolatile memory with a program of the integrated circuit 102 stored. The integrated circuit 102 performs various processing and controls according to the program read from the flash memory 104. The flash memory 104 does not have to be included in the SiP 100 necessarily but the integrated circuit 102 may read and perform the program from an external memory outside the SiP 100.

Figure 6:
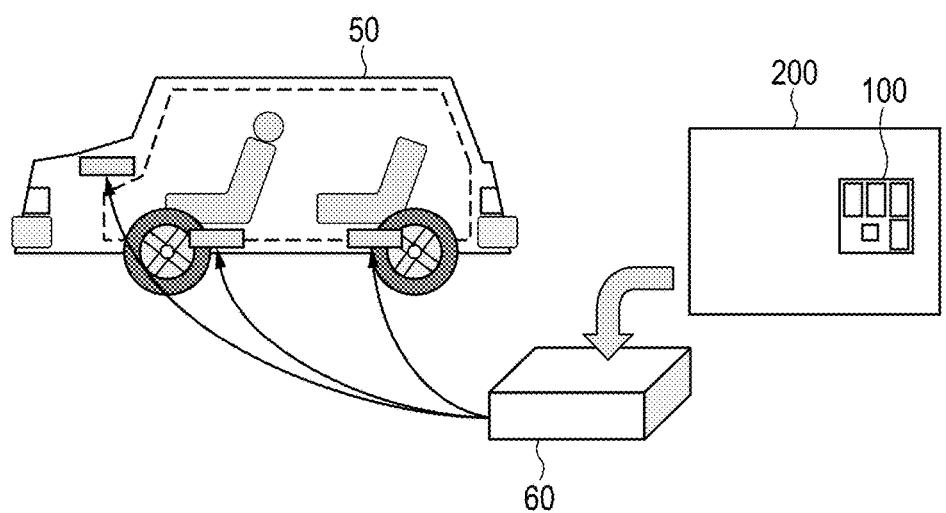
FIG. 6 is a view showing a vehicle with the SiP mounted there.

FIG. 6 shows a vehicle with the SiP 100 mounted there. The SiP 100 is mounted on another substrate (system board) 200 and accommodated in, for example, a box 60. In a vehicle 50, the box 60 is arranged, for example, in a dashboard, under a seat such as a driving seat, or under a rear seat.

Here, the temperature inside the vehicle 50 gets higher during the day and gets lower during the night. Especially, in summer, the temperature inside the vehicle 50 gets very high and in winter, it gets very low. The SiP 100 requires the performance of normal operation for a long period even in the various temperature atmosphere. For example, the SiP 100 requires the performance of the normal operation within the temperature range of −40° C. to 85° C. in the atmosphere. Considering the use outside Japan, the temperature range capable of normal operation may be expanded.

The SiP 100, particularly for the use of a vehicle, is sometimes used to perform the important processing related to the control of the vehicle 50 or the control. Therefore, a higher reliability for a long period is required of the on-vehicle SiP 100, mainly about the safe driving support system, than the reliability required of the normal system in package. If the soldering balls of the SiP 100 are ruptured, it disturbs the control of the vehicle, causing a danger to a driver or a fellow passenger of the vehicle 50, or a passenger of a nearby vehicle and a nearby walker. The embodiment provides the structure of improving the reliability of the SiP 100, especially for the use in a vehicle having a drastic change of the atmospheric temperature.

Figure 7:
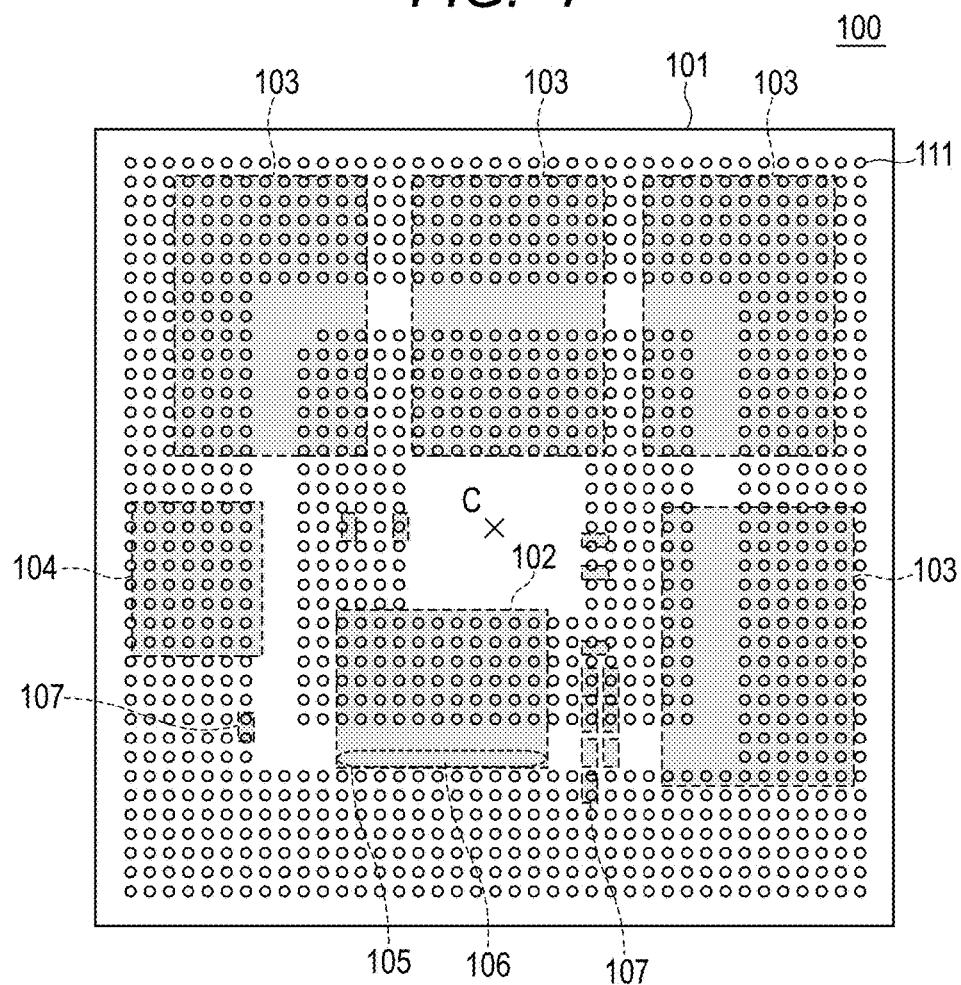
FIG. 7 is a top plan view showing the SiP according to the second embodiment.

FIG. 7 is a top plan view of the SiP 100. The plane as shown in FIG. 7 is the package substrate 101 viewed from the opposite side to the surface with the integrated circuit 102 mounted there. In FIG. 7, the positions (the fringes) with the integrated circuit 102, the DRAMs 103, the flash memory 104, and the passive elements 107 mounted are shown by the dashed line. The package substrate 101 has a plurality of soldering balls 111 on the surface opposite to the surface with the integrated circuit 102 mounted there.

The soldering balls 111 are arranged around the fringe of the package substrate 101 to surround the center C of the package substrate 101. In the embodiment, the soldering balls 111 are arranged in a direction along one side of the package substrate 101 and a direction along the other side orthogonal to the above to surround the center C of the package substrate 101 double. The package substrate 101 has a portion without the soldering balls 111 between the inner soldering balls (group) and the outer soldering balls (group).

In a flat type SiP, the integrated circuit 102 is often arranged eccentrically, specifically, at a position where the center of the package substrate 101 does not agree with the center of the integrated circuit 102, because of the efficiency of the parts arrangement and the wiring performance, the designing property of the semiconductor element, or the mounting performance of flip chip parts. Further, since many parts are mounted on the package substrate 101, the package (substrate) size becomes larger than the normal Flip Chip Ball Grid Array (FCBGA). The big package size enlarges a difference of deformation between the integrated circuit 102 and the package substrate 101 caused by a difference of the coefficient of thermal expansion therebetween. Then, in the embodiment, the integrated circuit 102 is arranged so that a region 106 corresponding to its farthest side (remote side) 105 viewed from the center of the package substrate 101 may overlap with the portion where the soldering balls 111 are not formed.

Figure 8:
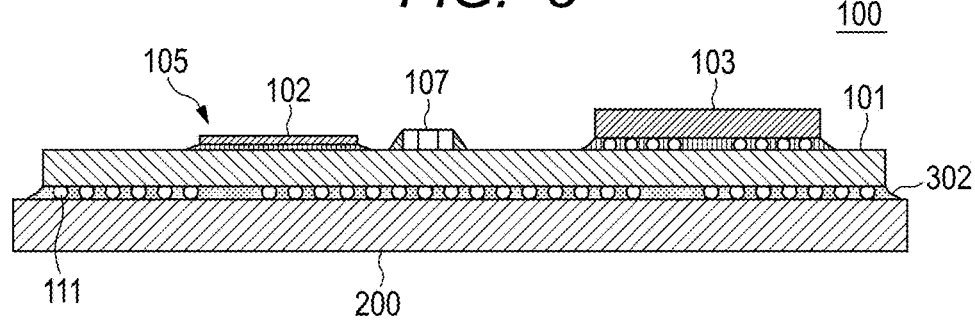
FIG. 8 is a cross-sectional view showing the SiP according to the second embodiment.

FIG. 8 is a cross-sectional view of the SiP 100. The parts arrangement of FIG. 8 is a little different from that of FIG. 7. The SiP 100 is flip-chip mounted on the system board 200. Further, the space between the system board 200 and the SiP 100 is sealed by the underfill resin 302. As shown in FIG. 8, in the SiP 100 of the embodiment, the soldering balls 11 do not exist in the region 106 (refer to FIG. 7) corresponding to the remote side 105 of the integrated circuit 102 on the package substrate 101. In other words, the package substrate 101 does not have the soldering balls 111 in the region 106 corresponding to the farthest side from the center of the package substrate 101, of the fringe of the integrated circuit 102.

The DRAMs 103 and the flash memory 104 are formed as the BGA package with the semiconductor elements mounted on the resin substrate. Therefore, a difference of the coefficient of thermal expansion is small between the DRAM 103 and flash memory and the package substrate 101. Accordingly, even when the soldering balls 111 exist just under the fringe of the DRAM 103 and the flash memory 104, it does not matter particularly. Further, the passive element 107 is small in size and the stress is small; therefore, the rupture of the soldering balls 111 does not matter.

In the embodiment, the package substrate 101 does not have the soldering balls 111 at the position corresponding to the inner side of the fringe of the integrated circuit 102 (refer to FIGS. 7 and 8). The package substrate 101 has the soldering balls 111 outside the fringe of the integrated circuit 102 in close vicinity to the fringe. In other words, from the viewpoint of the position corresponding to the fringe of the integrated circuit 102, a distance between the soldering ball 111 nearest to the center C of the package substrate 101 in a direction of going toward the center C and the position corresponding to the fringe is longer than a distance between the soldering ball 111 nearest to the opposite side to the above in the contrary direction and the position corresponding to the fringe.

The reason why the soldering balls 111 are not provided at the position corresponding to the inner side of the fringe of the integrated circuit 102 is because a stress becomes largest in this portion when the integrated circuit 102 is adhered to the package substrate 101. On the other hand, a stress is not so large at the position corresponding to the outside of the fringe of the integrated circuit 102; therefore, even when the soldering balls 111 are close to the position corresponding to the fringe of the integrated circuit 102, the soldering balls 111 are hardly ruptured.

Generally, according as a distance between the integrated circuit 102 and the soldering balls 111 in a plane surface shown in FIG. 7 is shorter, a connection pattern path between the terminal on the package substrate 101 and the integrated circuit 102 can be shorten more. According as the connection pattern path is shorter, the impedance (resistor value and inductance value) can be suppressed lower. The soldering balls 111 close to the outside of the fringe of the integrated circuit 102 can be used as the electrodes for core power supply, high speed Input Output (IO) power supply, or grounding power supply requiring a lower impedance.

Conclusion

In the embodiment, in the SiP 100 including the integrated circuit 102, the package substrate 101 does not have the soldering balls 111 in the region 106 corresponding to the farthest side from the center C of the package substrate 101, of the fringe of the integrated circuit 102. By adopting this structure, similarly to the first embodiment, even when there is a difference of the coefficient of thermal expansion between the package substrate 101 and the integrated circuit 102 mounted thereon, no provision of the soldering balls 111 at the position corresponding to the fringe of the integrated circuit 102 can effectively suppress open failure at ease. According to the embodiment, in the on-vehicle SiP 100, the reliability in use for a long time can be improved.

Further, in the embodiment, the soldering balls 111 are not provided at the position corresponding to the farthest side from the center C of the package substrate 101, of the four sides of the rectangular integrated circuit 102. In this case, it is only at one side of the four sides of the integrated circuit 102 that the soldering balls 111 are not arranged; therefore, compared with the structure of providing no soldering balls 111 at all the four sides, the arrangement of the soldering balls 111 is less restrictive. When the arrangement of the soldering balls 111 is less restrictive, it is possible to improve the wiring performance (cost and electric characteristic) of the system board 200 to mount the SiP 100 and the workability (manufacturing performance and yield) of the process of filling the space between the SiP 100 and the system board 200 with the underfill resin 302 in order to assure the reliability.

Third Embodiment

Figure 9:
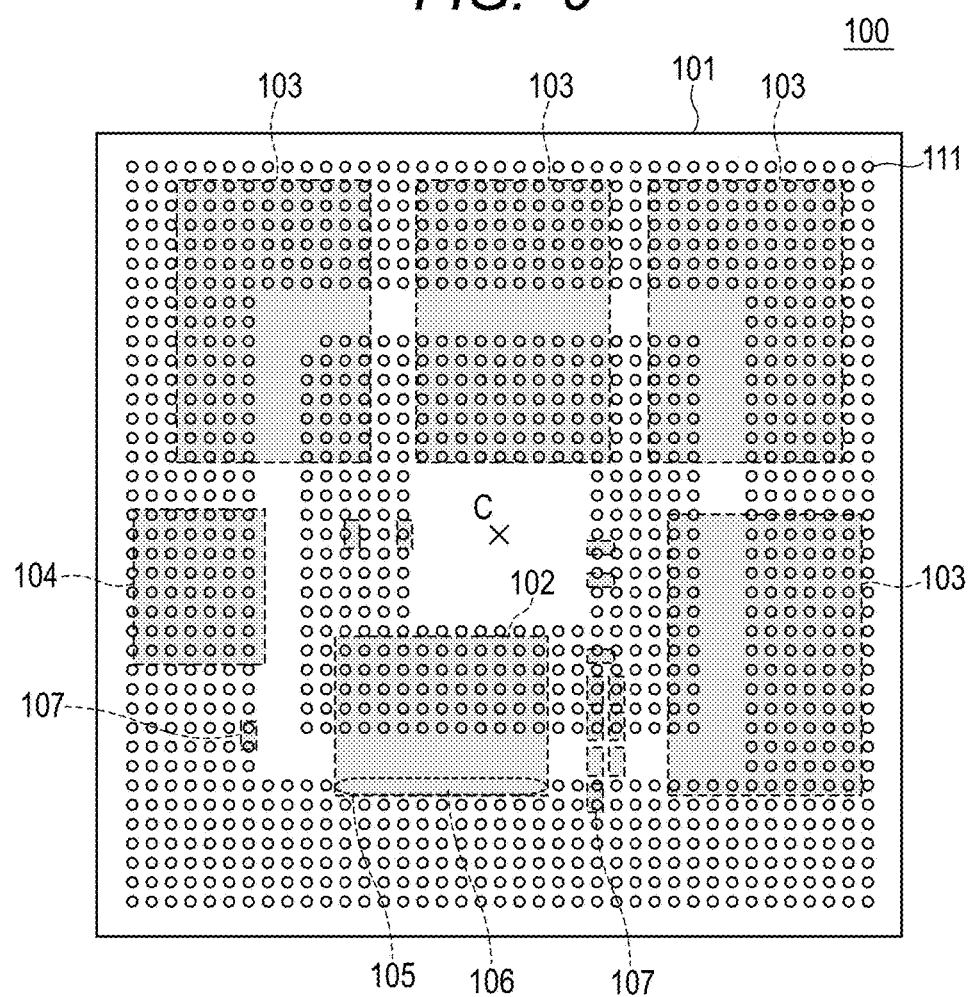
FIG. 9 is a top plan view showing SiP according to a third embodiment.

A third embodiment will be described. FIG. 9 is a top plan view of the SiP according to the third embodiment, viewed from the side opposite to the surface where the integrated circuit is mounted. The arrangement of the components in the system in package according to the embodiment is the same as shown in FIG. 4. In the embodiment, of the soldering balls 111 arranged according to a predetermine regularity, the soldering balls 111 in the overlap portion with the region 106 corresponding to the remote side 105 of the integrated circuit 102 are not arranged. The other portion is the same as that of the second embodiment.

In the second embodiment, the remote side 105 of the integrated circuit 102 agrees with the position without the soldering balls 111. However, when coupling the circuit to the system board 200, or depending on the situation of the wirings on the SiP 100, the position without the soldering balls 111 cannot be in accord with the region 106 corresponding to the remote side 105 of the integrated circuit 102 in some cases. In the embodiment, as shown in FIG. 9, even at the position where the soldering balls 111 could be formed according to the predetermined regularity, when this position overlaps with the region 106 corresponding to the remote side 105 of the integrated circuit 102, the soldering balls 111 are not arranged.

Figure 10:
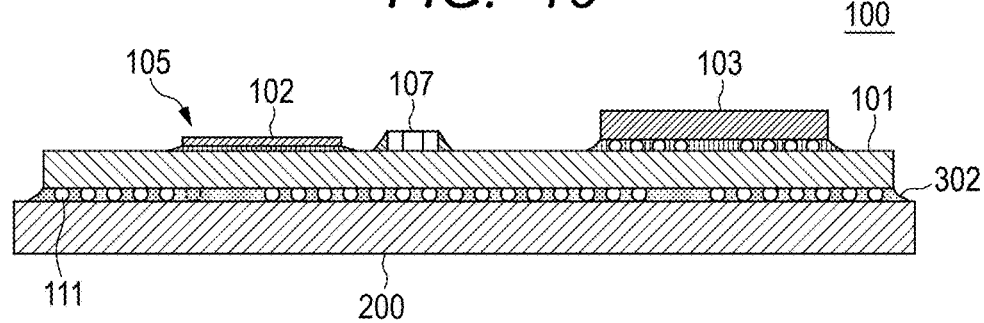
FIG. 10 is a cross-sectional view showing the SiP according to the third embodiment.

FIG. 10 is a cross-sectional view of the SiP 100 according to the embodiment. The SiP 100 is flip-chip mounted on the system board 200. The space between the system board 200 and the SiP 100 is sealed by the underfill resin 302. These points are the same as those of the second embodiment. As shown in FIG. 10, in the SiP 100 of the embodiment, the soldering balls 111 that could be formed according to the regularity do not exist in the region 106 corresponding to the remote side 105 of the integrated circuit 102 on the package substrate 101. Therefore, also in the embodiment, the package substrate 101 does not have the soldering balls 111 in the region 106 corresponding to the farthest side from the center of the package substrate 101, of the fringe of the integrated circuit 102.

Conclusion

Also in the SiP 100 according to the embodiment, the package substrate 101 does not have the soldering balls 111 in the region 106 corresponding to the remote side 105 of the integrated circuit 102; therefore, the same effect as the second embodiment can be obtained. Also in the embodiment, the package substrate 101 does not have the soldering balls 111 on the inner side of the remote side 105 of the integrated circuit 102 but has the soldering balls 111 outside the remote side in close vicinity. Especially, the soldering balls 111 in the vicinity of the integrated circuit 102 have a short connection path and a favorable electric characteristic and thereby they are important; therefore, it is advantageous that the soldering balls 111 not arranged can be suppressed at the minimum.

Modified Example

Figure 11:
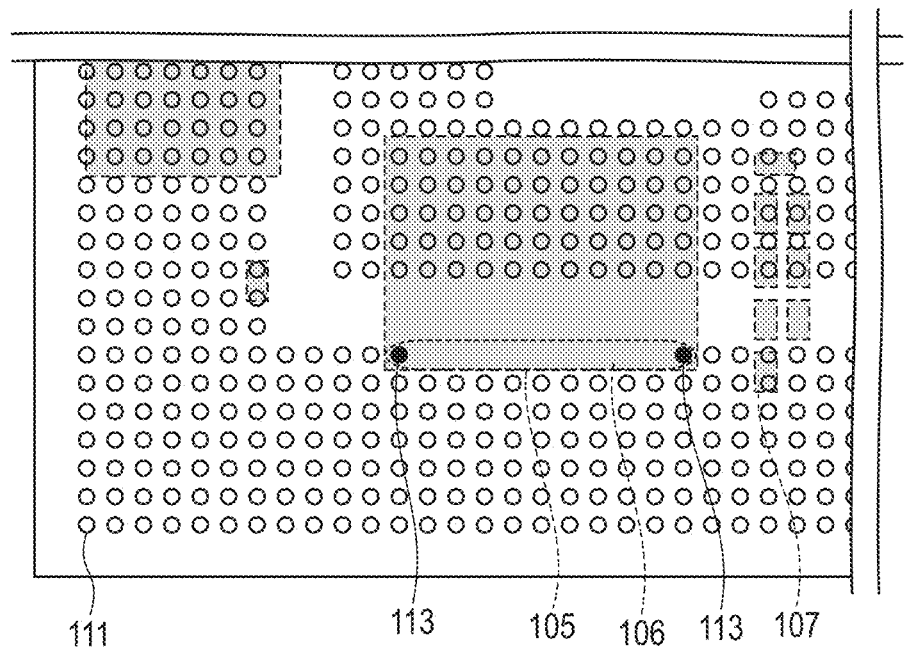
FIG. 11 is a top plan view showing SiP according to a modified example.

FIG. 11 is a top plan view of SiP according to a modified example viewed from the side opposite to the surface where the integrated circuit is mounted. The top plan view shown in FIG. 11 enlarges the vicinity of the region 106 corresponding to the remote side 105 of the semiconductor integrated circuit 102 in FIG. 9. The SiP 100a according to the modified example is formed by adding soldering balls as dummy terminals 113 in the region 106 corresponding to the remote side 105 of the semiconductor integrated circuit 102 to the SiP 100 shown in FIG. 9.

The dummy terminal is used as a terminal least affecting the actual operation even when it is ruptured. The dummy terminal is formed by, for example, a test terminal, a non-connect (NC) terminal, and a part of many existing grounding terminals. By using this dummy terminal, when the SiP 100a is secondarily mounted on the system board 200, the underfill resin 302 (refer to FIG. 10) filled between the SiP 100a and the system board 200 can be rectified. On the contrary, for the rectification, the soldering balls 111 may be removed.

In the third embodiment, as shown in FIG. 9, the soldering balls 111 are arranged along the fringe of the package substrate 101 in a way of surrounding the center C of the package substrate 101, except for the region 106 corresponding to the remote side 105 of the integrated circuit 102; however, the arrangement of the soldering balls 111 is not restricted to this. Instead of this arrangement, the soldering balls 111 may be arranged on the whole surface of the package substrate 101, except for the region 106 corresponding to the remote side 105 of the integrated circuit 102.

In the second and the third embodiments, the package substrate 101 has the portion without the soldering balls 111 selectively in the region 106 corresponding to the remote side 105, of the fringe of the integrated circuit 102; however, it is not restricted to this. Also in the second and the third embodiments, the package substrate 101 may have the portion without the soldering balls 111 at a position corresponding to at least a part of the fringe of the integrated circuit 102. Also in the second and the third embodiments, similarly to the first embodiment, the package substrate 101 may have the portion without the soldering balls 111 at the position corresponding to all the four sides of the rectangular integrated circuit 102.

Although the above embodiments have been described by way of example of the package substrate 101 having the soldering balls 111; however, it is not restricted to this. The package substrate 101 may have an electrode for the soldering ball 111 and the soldering ball 111 itself is not necessary.

Figure 12:
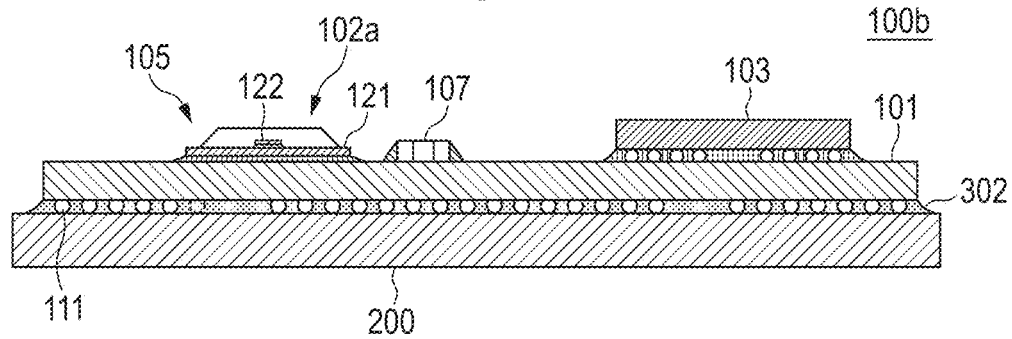
FIG. 12 is a cross-sectional view showing SiP according to another modified example.

In the second and the third embodiments, the example of the integrated circuit 102 (for example, refer to FIG. 8) as the semiconductor chip has been described; however, the integrated circuit 102 may be other than the semiconductor chip as far as the coefficient of thermal expansion thereof is different from that of the system board 2 with the package substrate 101 and the SiP 100 mounted there. FIG. 12 is a cross-sectional view showing SiP according to another modified example. In the SiP 100b according to the modified example, the soldering balls 111 are removed in the region 106 (refer to FIG. 9) corresponding to the remote side 105 of the semiconductor integrated circuit 102, similarly to the SiP 100 according to the third embodiment shown in FIG. 10.

In the SiP 100b according to the above modified example, the integrated circuit 102a includes a substrate 121 and a semiconductor element (semiconductor chip) 122. The substrate 121 is a substrate to mount the semiconductor chip 122 thereon. The substrate 121 is formed of, for example, a ceramic substrate and the coefficient of thermal expansion of the substrate 121 is different from that of the package substrate 101. Also in this case, the package substrate 101 does not have the soldering balls 111 at the position corresponding to the fringe of the integrated circuit 102a, which can suppress the rupture of the soldering balls 111 caused by a difference of the coefficient of thermal expansion. Similarly to the semiconductor integrated circuit 20 (for example, refer to FIG. 2) used in the first embodiment, the semiconductor integrated circuit 20 may be formed by a semiconductor element and another substrate to mount the above element thereon.

The semiconductor device according to the first embodiment can be applied to a vehicle or industrial application. The system in package according to the second and the third embodiments can be applied to a long term reliability (mainly temperature cycle) and a high speed related solution, for example, the production targeted for an on-vehicle information device. Further, the system in package according to the second and the third embodiments can be applied to the industrial application.

As mentioned above, the invention made by the inventor et al. has been described specifically based on the embodiments; however, the invention is not restricted to the above mentioned embodiments but it is needless to say that various modifications can be made without departing from the sprit of the invention.

What is claimed is:

1. A semiconductor system in package comprising:
a plurality of semiconductor integrated circuits including a first semiconductor integrated circuit; and
a package substrate having a first surface on which the semiconductor circuits are mounted,
wherein a coefficient of thermal expansion of the first semiconductor integrated circuit is different from a coefficient of thermal expansion of the package substrate,
wherein the package substrate includes electrodes for a plurality of soldering balls on a second surface opposite to the first surface where the semiconductor integrated circuits are mounted, and
wherein the package substrate does not have the electrodes for the soldering balls at a position corresponding to a length of at least one side of a fringe of the first semiconductor integrated circuit.

2. The system in package according to claim 1,
wherein the package substrate does not have the electrodes for the soldering balls at a position corresponding to the length of the at least one side of the fringe of the first semiconductor integrated circuit which is farthest from a center of the package substrate.

3. The system in package according to claim 1,
wherein viewed from a position corresponding to the fringe of the semiconductor integrated circuit, a distance between the electrode for the soldering ball existing nearest to the center in a direction of going toward the center of the package substrate and a position corresponding to the fringe of the first semiconductor integrated circuit is longer than a distance between the electrode for the soldering ball existing nearest in an opposite direction to the center of the package substrate and the position corresponding to the fringe of the first semiconductor integrated circuit.

4. The system in package according to claim 1,
wherein the electrodes for the soldering balls are arranged along a fringe of the package substrate to surround the center of the package substrate, except for the position corresponding to the length of the at least one side of the fringe of the first semiconductor integrated circuit.

5. The system in package according to claim 1,
wherein the electrodes for the soldering balls are arranged on the whole surface of the package substrate, except for the position corresponding to the length of the at least one side of the fringe of the first semiconductor integrated circuit.

6. A semiconductor system in package comprising:
a plurality of semiconductor integrated circuits including a first semiconductor integrated circuit; and
a package substrate having a first surface on which the semiconductor circuits are mounted,
wherein a coefficient of thermal expansion of the first semiconductor integrated circuit is different from a coefficient of thermal expansion of the package substrate,
wherein the package substrate includes electrodes for a plurality of soldering balls on a second surface opposite to the first surface where the semiconductor integrated circuits are mounted,
wherein the package substrate further includes the electrodes for soldering balls used as dummy terminals at positions corresponding to corners of at least one side of a fringe of the first semiconductor integrated circuit, and
wherein the package substrate does not have the electrodes for the soldering balls at a position corresponding to a length of the at least one side of the fringe of the first semiconductor integrated circuit other than the corners.

7. A semiconductor system in package for a vehicle comprising:
a semiconductor integrated circuit which receives sensor information from at least one on-vehicle sensor;
at least one memory element used by the semiconductor integrated circuit; and
a package substrate having a first surface on which the semiconductor integrated circuit and the at least one memory element are mounted,
wherein a coefficient of thermal expansion of the semiconductor integrated circuit is different from a coefficient of thermal expansion of the package substrate,
wherein the package substrate includes electrodes for a plurality of soldering balls on a second surface opposite to the first surface where the semiconductor integrated circuit and the at least one memory element are mounted, and
wherein the package substrate does not have the electrodes for the soldering balls at a position corresponding to a length of at least one side of a fringe of the semiconductor integrated circuit.

8. The system in package according to claim 1,
wherein the plurality of semiconductor integrated circuits includes a second semiconductor integrated circuit,
wherein a coefficient of thermal expansion of the second semiconductor integrated circuit is less than the coefficient of thermal expansion of the first semiconductor integrated circuit, and
wherein the package substrate has the electrodes for the soldering balls at positions corresponding to each side of a fringe of the second semiconductor integrated circuit.

9. The system in package according to claim 6,
wherein the plurality of semiconductor integrated circuits includes a second semiconductor integrated circuit,
wherein a coefficient of thermal expansion of the second semiconductor integrated circuit is less than the coefficient of thermal expansion of the first semiconductor integrated circuit, and
wherein the package substrate has the electrodes for the soldering balls at positions corresponding to each side of a fringe of the second semiconductor integrated circuit.

10. The system in package according to claim 7,
wherein a coefficient of thermal expansion of the at least one memory element is less than the coefficient of thermal expansion of the semiconductor integrated circuit, and
wherein the package substrate has the electrodes for the soldering balls at positions corresponding to each side of a fringe of the at least one memory element.

* * * * *